United States Patent [19]
Gross, Jr.

[11] Patent Number: 6,034,631
[45] Date of Patent: Mar. 7, 2000

[54] COMPARATOR ERROR CORRECTION IN FLASH ANALOG-TO-DIGITAL CONVERTER

[75] Inventor: George Francis Gross, Jr., Fleetwood, Pa.

[73] Assignee: Lucent Technologies Inc., Murray Hill, N.J.

[21] Appl. No.: 09/018,670

[22] Filed: Feb. 4, 1998

[51] Int. Cl.[7] .................................................. H03M 1/36
[52] U.S. Cl. ............................................. 341/160; 341/94
[58] Field of Search .............................. 341/159, 94, 160

[56] References Cited

U.S. PATENT DOCUMENTS

| 4,712,087 | 12/1987 | Traa | 341/160 |
|---|---|---|---|
| 4,897,657 | 1/1990 | Brubaker | 341/159 |
| 4,983,968 | 1/1991 | Nguyen et al. | 341/159 |
| 5,029,305 | 7/1991 | Richardson | 341/159 |
| 5,781,132 | 7/1998 | Lewyn | 341/159 |

*Primary Examiner*—Howard L. Williams
*Attorney, Agent, or Firm*—David L. Smith

[57] ABSTRACT

There is disclosed, a converter for converting an input signal from one form to another includes a generator circuit for generating as a thermometer code a plurality of binary signals from the input signal. The converter includes one or more enhanced majority gate circuits for correcting a broken thermometer code to be a corrected thermometer code. The corrected thermometer code is decoded to provide a digital code corresponding to the input signal.

13 Claims, 3 Drawing Sheets

COMPARATOR ERROR CORRECTION IN FLASH ANALOG-TO-DIGITAL CONVERTER

FIELD OF THE INVENTION

This invention relates to correcting errors in digital codes and in particular to correcting errors in thermometer type digital codes by employing enhanced majority gate decoding.

BACKGROUND OF THE INVENTION

ADCs are used to convert an analog signal to a digitally coded signal. ADCs span a spectrum of designs which can, with the appropriate circuitry, range from a successive approximation type that generally requires one clock cycle per bit of resolution on one end of the spectrum, to parallel flash types, employing multiple comparators, that generally require one clock cycle for all bits of resolution conversion at the other end of the spectrum.

Flash analog-to-digital converters include comparators, each of which receives a representation of the analog input signal and a predetermined reference voltage. The comaparator outputs ideally collectively form a "thermometer code" with all outputs below a particular output being of one state, and all outputs above the particular output being of another state. The transition from one state in the ideal thermometer code to another state is decoded to generate an output that is a digital representation corresponding to the analog input signal to the converter.

Comparators employed in such converters may be subject to offset errors, noise spikes, or stuck-at-particular-state faults, resulting in a thermometer code with more than one transition from one state to another. Multiple transitions from one state to another in a thermometer code is commonly referred to as bubbles in a thermometer code. Having bubbles in the thermometer code results in multiple apparent transitions, and conversion of the thermometer code to a single, unique, digital representation of the applied analog input signal becomes impossible.

A simple majority gate technique has been used to correct errors in thermometer codes that were not ideal. In the simple majority gate technique, an odd number of bits in the thermometer code, typically centered at the bit being evaluated, are considered in determining whether a bit is correct or incorrect. For example, to determine whether a particular bit is correct using a three input majority gate technique, that bit as well as the bit above and the bit below in the thermometer code are considered. The state of two out of three bits constitutes a majority. Thus, if two of the three bits, which are inputs to a majority gate circuit are logic one, then the correct output state for the particular bit is also a logic one. Correspondingly, if two of the three inputs are logic zero, then the correct output state for the particular bit is a zero.

While the simple majority gate technique corrects for some errors, and generally the accuracy of the correction is improved by considering an increased number of bits, there remain some thermometer code errors that are not properly corrected by simple majority gate techniques. What is needed is a technique to correct for broken thermometer codes that provides better performance than a simple majority gate technique.

SUMMARY OF THE INVENTION

In accordance with the invention, a converter for converting an input signal from one form to another includes a generator circuit for generating as a thermometer code a plurality of binary signals from the input signal. The converter includes one or more enhanced majority gate circuits for correcting a broken thermometer code to be a corrected thermometer code. The corrected thermometer code is decoded to provide a digital code corresponding to the input signal.

DETAILED DESCRIPTION

Figure 1:
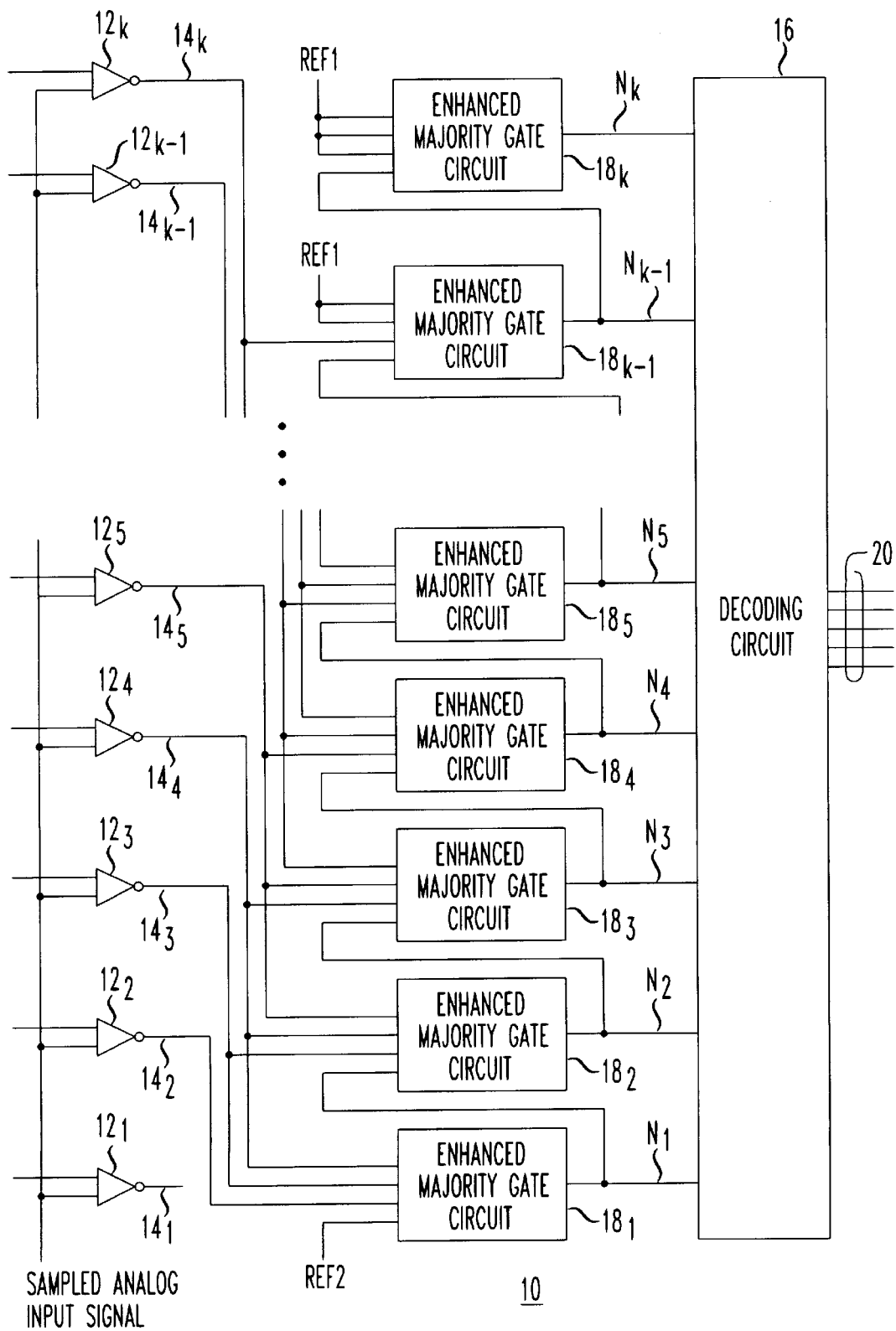
FIG. 1 is a schematic diagram of a portion of an analog-to-digital converter in accordance with the present invention.

A schematic diagram of a portion of an ADC in accordance with an illustrative embodiment of the invention is shown in FIG. 1. The ADC may be a current or voltage driven converter 10 that is single ended or fully differential, and may or may not include subranging. The converter may be a stand-alone converter or may be a portion of an integrated circuit such as a microprocessor, microcontroller or digital signal processor. Converter 10 includes comparators $12_1$ through $12_k$, where k is the number of comparators. Each comparator provides a respective output $14_1$ through $14_k$ that takes on a binary state of a logic high or a logic low. Collectively, the outputs 14 represent a thermometer code. The comparator outputs in a lower portion of the thermometer code take on a first logic state, such as a logic zero, and the comparator outputs in an upper portion of the thermometer code take on a second logic state, such as a logic one.

Ideally, there is no more than one transition in the thermometer code from the first logic state to the second logic state. The transition, which is indicative of the analog input signal, is detected and translated into a digital code by decoding circuit 16. However, due to such factors as comparator offset errors, noise spikes, and stuck-at-particular state fault, there is often more than one transition in the thermometer code from a first state to a second state. Having more than one transition in the thermometer code is referred to as a broken thermometer code, with the multiple transitions being bubbles. To correct or compensate for the broken thermometer code, and thereby determine where the single transition should occur in the thermometer code, a plurality of enhanced majority gate circuits 18 are interposed between the comparators 12 and decoding circuit 16. Enhanced majority gate circuits 18 receive as inputs selected ones of the comparator outputs 14 and provide respective outputs to decoding circuit 16. The number of enhanced majority gate circuits 18 corresponds in number to the number of comparators and may be one less than the number of comparators.

Figure 2:
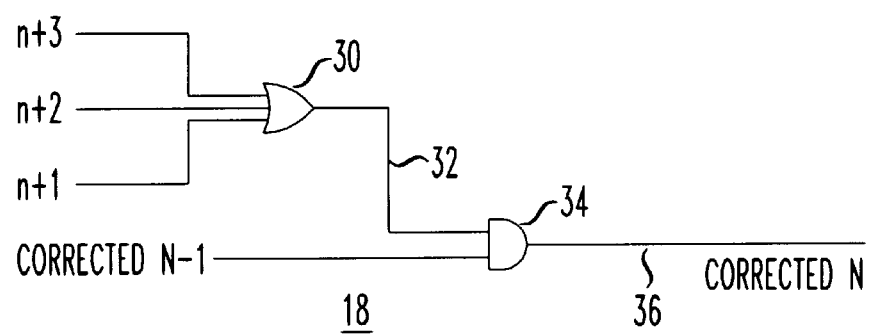
FIG. 2 is a schematic diagram of an enhanced majority gate circuit useful in the analog-to-digital converter of FIG. 1.

A schematic diagram of an enhanced majority gate circuit 18 in accordance with the invention is shown in FIG. 2. Each of enhanced majority gate circuits 18 may be identical. Each output 14 may be provided as an input to more than one of enhanced-majority gate circuits 18. Circuit 18 has four inputs denoted n+3, n+2, n+1, and corrected n−1, as well as an output denoted corrected N. Corrected N output may represent the corrected form of any output 14 in the thermometer code. Input n+1 represents the output 14 in the thermometer code "above" (as illustrated in FIG. 1) the $n^{th}$ input, and corresponds to a larger digital representation of the analog input signal. When the $n^{th}$ input is sufficiently close to the top of the thermometer code(as illustrated in FIG. 1), all inputs to circuit 18 above the $n^{th}$ input for which there are no thermometer codes are tied to a first reference, REF1, such as a logic low. When corrected output N is sufficiently close to the bottom of the thermometer code, all inputs below n for which there are no thermometer code outputs are tied to a second reference, REF2, such as a logic high. One skilled in the art could simplify the enhanced majority gate circuits 18 at the top and bottom of the thermometer code, rather than tie selected ones of the inputs to a predetermined logic state.

One example of how an enhanced majority gate circuit would be coupled to the comparator outputs would be for the evaluation of output $14_2$ by enhanced majority gate circuit $18_2$. Enhanced majority gate circuit $18_2$ has input n+1 coupled to output $14_3$; input n+2 coupled to output $14_4$; input n+3 coupled to output $14_5$; and corrected N−1 input coupled to the output of enhanced majority gate $18_1$.

As illustrated in FIG. 2, inputs n+1, n+2 and n+3 to enhanced majority gate circuit 18 are provided as inputs to OR gate 30. OR gate 30 output 32 provides a first input to AND gate 34. The output of the previous enhanced majority gate 18, denoted corrected N−1, provides a second input to AND gate 34. The logic elements comprising enhanced majority gate circuit 18 logically combine the inputs to produce AND gate 34 output 36. AND gate 34 output 36 is the corrected output, denoted corrected N, of enhanced majority gate circuit 18 for input n. The corrected outputs N are collectively a corrected thermometer code which may be decoded by decoding circuit 16 to provide a digital output 20 of an appropriate number of bits. The output N of enhanced majority gate circuit 18 for all combinations of the four inputs is shown in Table I.

TABLE I

| n + 3 | n + 2 | n + 1 | Corrected N − 1 | Corrected N |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 0 | 0 | 0 |
| 1 | 0 | 0 | 1 | 1 |
| 1 | 0 | 1 | 0 | 0 |
| 1 | 0 | 1 | 1 | 1 |
| 1 | 1 | 0 | 0 | 0 |
| 1 | 1 | 0 | 1 | 1 |
| 1 | 1 | 1 | 0 | 0 |
| 1 | 1 | 1 | 1 | 1 |

Figure 3:
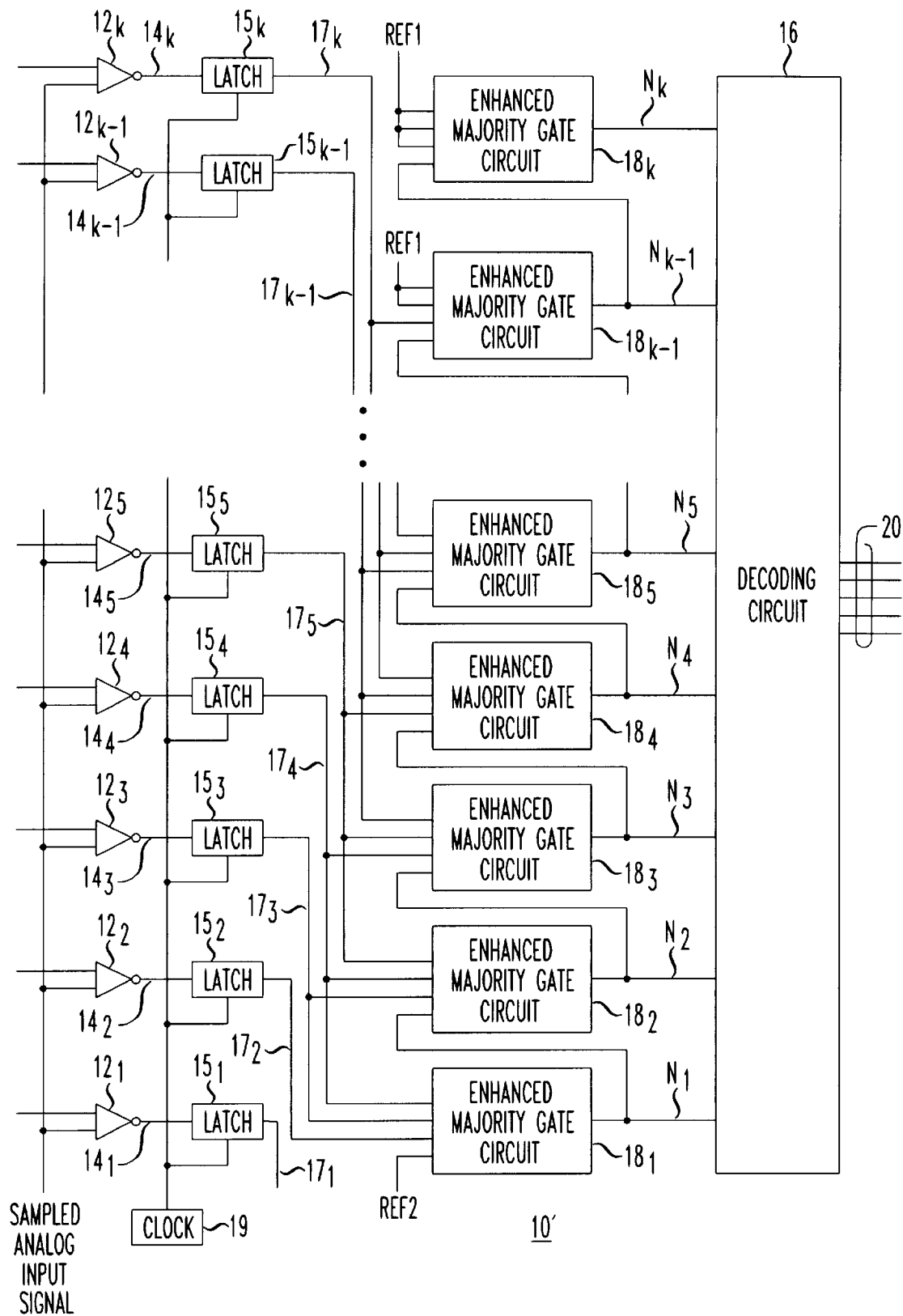
FIG. 3 is a schematic diagram of a portion of an analog-to-digital converter illustrating an alternative embodiment of the invention.

One skilled in the art could develop a conjugate circuit wherein the asymmetry exhibited by the inputs is also reversed. Since the determination of any corrected output relies on the previous output being corrected, a ripple throughput time is produced. When the ripple through-put time becomes large so as to be objectionable with respect to conversion speed, a pipeline can be established. A set of k latches can be introduced to latch the comparator outputs, as illustrated in the alternate embodiment shown in FIG. 3. The enhanced majority gates can operate to correct the previous comparator outputs while the comparators are making decisions for the next sample conversion. In converter 10' shown in FIG. 3, the outputs $14_1$ through $14_k$ of comparators $12_1$ through $12_k$ are latched into latches $15_1$ through $15_k$ when the latches are clocked, such as being clocked by clock 19. Outputs $17_1$ through $17_k$ of latches $15_1$ through $15_k$ are connected as inputs to enhanced majority gates $18_1$ through $18_k$. The addition of latches $15_1$ through $15_k$ adds conversion output latency but does not add delay to the conversion time.

While the invention has been described as correcting errors in digital codes, such as a broken thermometer code in an analog-to-digital converter, the invention is not limited thereto. The invention may, for example, be used to provide error correction of other binary codes without regard to how they are generated, such as binary data transmitted over a channel. In addition, one skilled in the art could develop a conjugate enhanced majority gate circuit wherein the asymmetry exhibited by the inputs is reversed and the logic sense of the binary code is also reversed.

What is claimed is:

1. Apparatus for correcting errors in thermometer codes, comprising:

a circuit adapted to generate a plurality of binary output signals;

at least one enhanced majority gate circuit coupled to receive as inputs selected ones of the binary output signals as first, second, third, and fourth inputs, the at least one enhanced majority gate circuit providing a corrected output that takes on a first logic state when either the first, second or third inputs are a logic high and the fourth input is a logic high, and the at least one enhanced majority gate circuit providing a corrected output that takes on a second state otherwise; and a decoding circuit adapted to receive as an input the corrected output from the at least one enhanced majority gate circuit, the decoding circuit adapted to decode the input to provide a digitally encoded signal.

2. Apparatus as recited in claim 1, wherein there are a predetermined number of binary output signals, the at least one enhanced majority gate circuit comprising a number of enhanced majority gate circuits corresponding to the predetermined number of binary output signals.

3. Apparatus as recited in claim 1, wherein at least one of the inputs to the at least one enhanced majority gate circuit is coupled to a predetermine logic level.

4. Apparatus as recited in claim 1, wherein the apparatus is a converter adapted to receive analog input signal.

5. Apparatus as recited in claim 1, further comprising:

at least one latch adapted to receive and store one of said plurality of binary output signals.

6. A converter for converting a signal from one form to another, comprising:

a generator circuit adapted to receive an analog input signal and generate a plurality of binary output signals therefrom;

a plurality of enhanced majority gate circuits coupled to the generator circuit, the enhanced majority gate circuits corresponding in number to the plurality of binary output signals, the enhanced majority gate circuits each coupled to receive as input signals selected ones of the binary output signals as first, second, third, and fourth input signals, each of the enhanced majority gate circuits providing a corrected output that takes on a first logic state when either the first, second, or third input signals are logic high and the fourth input is a logic high, and the enhanced majority gate circuits providing a corrected output that takes on a second state otherwise; and a decoding circuit adapted to receive as inputs the corrected output from the enhanced majority gate circuits, the decoding circuit adapted to decode the inputs to provide a digitally encoded signal.

7. A converter as recited in clam 6, wherein the converter is fabricated in an integrated circuit.

8. A converter as recited in claim 7, wherein the integrated circuit is a digital signal processor.

9. A converter as recited in claim 6, further comprising:

at least one latch adapted to receive and store one of said plurality of binary output signals.

10. A converter for converting a signal from one form to another, comprising:

a generator circuit adapted to receive an analog input signal and generate plurality of binary output signals therefrom;

at least one enhanced majority gate circuit coupled to receive as inputs selected ones of the binary output signals as first, second, third, and fourth inputs, the at least one enhanced majority gate circuit providing a corrected output that takes on a first logic state when either the first, second or third inputs are logic high and the fourth input is a logic high and the at least one enhanced majority gate circuit providing a corrected output that takes on a second state otherwise; and a decoding circuit adapted to receive as an input the corrected output from the at least one enhanced majority gate circuit, the decoding circuit adapted to decode the input to provide a digitally encoded signal.

11. A converter as recited in clam 10, wherein the converter is fabricated in an integrated circuit.

12. A converter as recited in claim 11, where in the integrated circuit is a digital signal processor.

13. A converter as recited in claim 10, further comprising:

at least one latch adapted to receive and store one of said plurality of binary output signals.

* * * * *